US012545994B2

(12) United States Patent
Fujita et al.

(10) Patent No.: US 12,545,994 B2
(45) Date of Patent: Feb. 10, 2026

(54) FILM FORMING METHOD AND FILM FORMING APPARATUS

(71) Applicant: Tokyo Electron Limited, Tokyo (JP)

(72) Inventors: Sena Fujita, Nirasaki (JP); Tadashi Mitsunari, Nirasaki (JP); Takamichi Kikuchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 335 days.

(21) Appl. No.: 17/923,312

(22) PCT Filed: Apr. 27, 2021

(86) PCT No.: PCT/JP2021/016712

§ 371 (c)(1),
(2) Date: Nov. 4, 2022

(87) PCT Pub. No.: WO2021/225091

PCT Pub. Date: Nov. 11, 2021

(65) Prior Publication Data

US 2023/0243031 A1 Aug. 3, 2023

(30) Foreign Application Priority Data

May 8, 2020 (JP) ................................ 2020-082840
Apr. 5, 2021 (JP) ................................ 2021-064172

(51) Int. Cl.

| | |
|---|---|
| ***C23C 16/08*** | (2006.01) |
| ***C23C 16/458*** | (2006.01) |
| ***C23C 16/505*** | (2006.01) |

(52) U.S. Cl.
CPC .......... *C23C 16/08* (2013.01); *C23C 16/4583* (2013.01); *C23C 16/505* (2013.01)

(58) Field of Classification Search
CPC .... C23C 16/08; C23C 16/4583; C23C 16/505
See application file for complete search history.

(56) References Cited

U.S. PATENT DOCUMENTS 9,953,840 B2 * 4/2018 Marumoto .......... H01L 21/3065
2021/0020432 A1 * 1/2021 Blanquart .............. C23C 16/26

FOREIGN PATENT DOCUMENTS

| | | | |
|---|---|---|---|
| CN | 112242295 | A | 1/2021 |
| JP | 2018-117038 | A | 7/2018 |
| JP | 2021-19199 | A | 2/2021 |

* cited by examiner

*Primary Examiner* — Michael P Wieczorek
(74) *Attorney, Agent, or Firm* — Nath, Goldberg & Meyer; Jerald L. Meyer; Tanya E. Harkins

(57) ABSTRACT

A film forming method includes: supplying a liquid to a concave portion of a substrate whose surface includes the concave portion and a convex portion which are adjacent to each other; and selectively forming a film on a top surface of the convex portion of the surface of the substrate by supplying a processing gas, which chemically changes the liquid, to the surface of the substrate, and moving the liquid from the concave portion to the top surface of the convex portion by a reaction between the processing gas and the liquid.

21 Claims, 13 Drawing Sheets

FILM FORMING METHOD AND FILM FORMING APPARATUS

This is a National Phase Application filed under 35 U.S.C. 371 as a national stage of PCT/JP2021/016712, filed Apr. 27, 2021, an application claiming the benefit of Japanese Application No. 2020-082840, filed May 8, 2020, and Japanese Application No. 2021-064172, filed Apr. 5, 2021, the content of each of which is hereby incorporated by reference in its entirety.

TECHNICAL FIELD

The present disclosure relates to a film forming method and a film forming apparatus.

BACKGROUND

Patent Document 1 discloses a method of selectively forming a film on a specific region of a substrate without using photolithography technology. This method includes selectively forming Si adsorption sites on a flat surface of the substrate out of the flat surface of the substrate and the wall of a trench recessed from the flat surface.

PRIOR ART DOCUMENT

Patent Document

Patent Document 1: Japanese Laid-Open Patent Publication No. 2018-117038

SUMMARY

An aspect of the present disclosure provide a technique for selectively forming a film on a top surface of a convex portion in a substrate surface including a concave portion and the convex portion that are adjacent to each other.

A film formation method according to an aspect of the present disclosure includes following operations (A) and (B). Operation (A) supplies a liquid to a concave portion of a substrate whose surface includes the concave portion and a convex portion which are adjacent to each other. Operation (B) selectively forms a film on a top surface of the convex portion of the surface of the substrate by supplying a processing gas, which chemically changes the liquid, to the surface of the substrate, and moving the liquid from the concave portion to the top surface of the convex portion by a reaction between the processing gas and the liquid.

According to an aspect of the present disclosure, it is possible to selectively form a film on a top surface of a convex portion in a substrate surface including a concave portion and the convex portion which are adjacent to each other.

DETAILED DESCRIPTION

Figure 1:
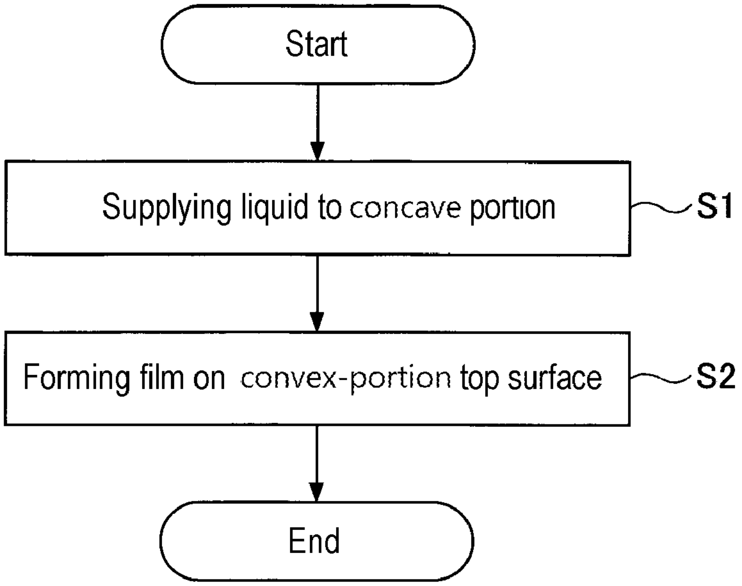
FIG. 1 is a flowchart showing a film forming method according to an embodiment.

Hereinafter, embodiments of the present disclosure will be described with reference to the drawings. Throughout the drawings, the same or corresponding constituent elements will be denoted by the same reference numerals, and descriptions thereof will be omitted.

An example of a film forming method will be described with reference to FIG. 1. The film forming method includes steps S1 and S2. In step S1, as shown in FIG. 2A, a liquid L is supplied to a concave portion Wb out of the concave portion Wb and a convex portion We forming a substrate surface Wa. The liquid L may be directly supplied to the concave portion Wb, or may be supplied to the concave portion Wb from a top surface of the convex portion Wd. Further, the liquid L may overflow from the concave portion Wb and cover the top surface of the convex portion Wd. The substrate surface Wa includes a concave-portion bottom surface, a concave-portion side surface, and a concave-portion top surface Wd. The concave-portion top surface Wd is a flat surface, and the concave portion Wb is recessed from the concave-portion top surface Wd.

A substrate W includes, for example, a base substrate W1 including a silicon wafer or the like, and an uneven film W2 formed on the base substrate W1. The uneven film W2 forms the concave portion Wb and the convex portion Wc. The concave portion Wb is a trench, a via hole, or the like. In the present embodiment, although the concave portion Wb penetrates the uneven film W2, it may not penetrate the uneven film W2. The convex portion We may be a pillar or the like. In the present embodiment, although the uneven film W2 is an insulating film, it may be a conductive film or a semiconductor film. However, the concave portion Wb and the convex portion We may be formed on the surface of the silicon wafer.

The liquid L may have a strong intermolecular force. The stronger the intermolecular force, the stronger a cohesive force. If the cohesive force of the liquid L is large, evaporation of the liquid L can be prevented. The intermolecular force of the liquid L is, for example, 30 kJ/mol or more.

The liquid L is, for example, a halide. A liquid halide is formed by, for example, a reaction between a raw material gas of halide and a reaction gas that reacts with the raw material gas. Generation of the liquid L may be promoted by plasmarizing both the raw material gas and the reaction gas or by plasmarizing the reaction gas. The raw material gas is, for example, a $TiCl_4$ gas and the reaction gas is, for example, an $H_2$ gas.

The $TiCl_4$ gas and the $H_2$ gas are generally used for forming a Ti film, not for forming the liquid L. The Ti film is formed by, for example, a CVD (Chemical Vapor Deposition) method or an ALD (Atomic Layer Deposition) method. In the CVD method, the $TiCl_4$ gas and the $H_2$ gas are supplied to the substrate W at the same time. On the other hand, in the ALD method, the $TiCl_4$ gas and the $H_2$ gas are alternately supplied to the substrate W. According to the CVD method or the ALD method, the following formulas (1) to (3) are presumed to contribute to the formation of the Ti film.

$$TiCl_4+H_2 \rightarrow TiH_xCl_y \quad (1)$$

$$TiH_xCl_y \rightarrow TiCl_2+HCl \quad (2)$$

$$TiCl_2+H_2 \rightarrow Ti+HCl \quad (3)$$

In the above formulas (2) and (3), $TiCl_2$ may be TiCl or $TiCl_3$.

In the formation of the Ti film, the temperature of the substrate W is controlled to 400 degrees C. or higher. As a result, the reactions of the above formulas (1) to (3) proceed sequentially to form the Ti film.

On the other hand, in the formation of the liquid L, the temperature of the substrate W is controlled to −100 degrees C. to 390 degrees C., specifically 20 degrees C. to 350 degrees C. As a result, since the reaction of the above formula (2) and the reaction of the above formula (3) are suppressed, the liquid L containing $TiH_xCl_y$ is formed. The liquid L may include Ti, TiCl, $TiCl_2$, $TiCl_3$, or $TiCl_4$. The temperature of the substrate W may be lower than a decomposition point of the liquid L.

The raw material gas is not limited to the $TiCl_4$ gas. For example, the raw material gas may be a silicon halide gas such as a $SiCl_4$ gas, a $Si_2Cl_6$ gas, or a $SiHCl_3$ gas, or a metal halide gas such as a $WCl_4$ gas, a $VCl_4$ gas, an $AlCl_3$ gas, a $MoCl_5$ gas, a $SnCl_4$ gas, or a $GeCl_4$ gas. The raw material gas may contain halogen, and may contain bromine (Br), iodine (I), fluorine (F), or the like instead of chlorine (Cl). When the temperature of the substrate W is low, these raw material gases also mainly undergo the same reaction as in the above formula (1) to form a halide liquid L.

Also, the reaction gas is not limited to the $H_2$ gas. Any reaction gas may be used as long as it can form the liquid L by the reaction with the raw material gas. For example, the reaction gas may be a $D_2$ gas. The reaction gas may be supplied together with an inert gas such as an argon gas.

Step S1 includes, for example, supplying the raw material gas and the reaction gas to the substrate W at the same time. In this case, step S1 may further include plasmarizing both the raw material gas and the reaction gas. The reaction between the raw material gas and the reaction gas can be promoted by plasmarizing these gases. In addition, plasmarizing these gases facilitates the formation of the liquid L at a low substrate temperature.

In this embodiment, although step S1 includes supplying the raw material gas and the reaction gas to the substrate W at the same time, it may include supplying the raw material gas and the reaction gas to the substrate W alternately. In the latter case, step S1 may further include plasmarizing the reaction gas. The reaction between the raw material gas and the reaction gas can be promoted by plasmarizing this gas. In addition, plasmarizing this gas facilitates the formation of the liquid L at a low substrate temperature. Further, step S1 may include supplying the raw material gas alone to the substrate W.

The liquid L may have a strong intermolecular force, and may be an ionic liquid, a liquid metal, a liquid polymer, or the like. The metal may be a pure metal or an alloy. The polymer may be an oligomer or polymer formed by polymerizing two or more molecules of, for example, a $Si_2Cl_6$ gas, a $SiCl_4$ gas, a $SiHCl_3$ gas, a $SiH_2Cl_2$ gas, a $SiH_3Cl$ gas, a $SiH_4$ gas, a $Si_2H_6$ gas, a $Si_3H_8$ gas, a $Si_4H_{10}$ gas, a cyclohexasilane gas, a tetraethoxysilane (TEOS) gas, a dimethyldiethoxysilane (DMDEOS) gas, a 2,4,6,8-tetramethylcyclotetrasiloxane (TMCTS) gas, a trisilylamine (TSA) gas, or the like, and may be siloxane, polysilane, or polysilazane. Further, the liquid L may be silanol or the like. These liquids L are supplied to the concave portion Wb of the substrate W by a spin coating method, or are synthesized inside a processing container accommodating the substrate W and are then supplied to the concave portion Wb of the substrate W.

In step S2, as shown in FIGS. 2B and 2C, a processing gas G that chemically changes the liquid L is supplied to the substrate surface Wa, and a reaction between the processing gas G and the liquid L causes the liquid L to move from the concave portion Wb to the concave-portion top surface Wd, thereby selectively forming a film W3 on the concave-portion top surface Wd of the substrate surface Wa. The thin film W3 may also be formed on the side surface of the recess or the bottom surface of the recess. The film W3 may be a solid or a viscous body. The thickness of the film W3 may be controlled by the supply amount of the liquid L and the number of cycles to be described later.

The processing gas G is supplied, for example, from above the substrate surface Wa and reacts with the liquid L. The liquid L chemically changes by reacting with the processing gas G. Since the chemical change gradually progresses from the surface of the liquid L, a difference in surface tension occurs and volumetric expansion or volumetric contraction occurs from the surface of the liquid L, thereby causing the liquid L to become unstable and generate convection. Since the surface of the liquid L changes into a substance with high surface tension by the reaction with the processing gas G, the liquid L moves toward the concave-portion top surface Wd. In addition, the liquid L is dragged by the increase/decrease in volume due to the chemical change of the surface of the liquid L to move toward the concave-portion top surface Wd. The liquid L finally moves to the concave-portion top surface Wd by the reaction with the processing gas G.

Further, when the liquid L undergoes the chemical change, the reaction between the liquid L and the processing gas G causes the liquid L to degas. The motion of the liquid L caused by the generation of degas is also considered to be a factor contributing to the movement of the liquid L. Further, it is considered that minute vibration of the substrate W may also be a factor contributing to the movement of the liquid L.

The processing gas G contains an element that is introduced into the liquid L by the reaction with the liquid L, for example. That is, the processing gas G contains an element that is introduced into the film W3. For example, oxygen in the processing gas G is introduced into the liquid L to obtain the film W3 which is an oxide. Alternatively, nitrogen in the processing gas G is introduced into the liquid L to obtain the film W3 which is a nitride. Any element may be used as long as the element in the processing gas G can be introduced into the liquid L. In that process, the element forming the liquid L may be degassed.

For example, the processing gas G includes an oxygen-containing gas. The oxygen-containing gas contains oxygen as an element to be introduced into the liquid L. The oxygen-containing gas may further contain nitrogen as an element to be introduced into the liquid L. The oxygen-containing gas includes, for example, an $O_2$ gas, an $O_3$ gas), an $H_2O$ gas, an NO gas, or an $N_2O$ gas.

The processing gas G may include a nitrogen-containing gas. The nitrogen-containing gas contains nitrogen as an element to be introduced into the liquid L. The nitrogen-containing gas includes, for example, an $N_2$ gas, an $NH_3$ gas, an $N_2H_4$ gas, or an $N_2H_2$ gas.

The processing gas G may include a gas of hydride. The hydride gas contains an element bonded to hydrogen, such as Si, Ge, B, C, or P, as an element to be introduced into the liquid L. The hydride gas includes, for example, a hydrocarbon gas such as an $SiH_4$ gas, an $Si_2H_6$ gas, a $GeH_4$ gas, a $B_2H_6$ gas or a $C_2H_4$ gas, or a $PH_3$ gas.

The processing gas G may degas the element that forms the liquid L, by the reaction with the liquid L. For example, the processing gas G includes a reducing gas. The reducing gas is, for example, a hydrogen ($H_2$) gas or a deuterium ($D_2$) gas.

The processing gas G may be supplied together with an inert gas such as an argon gas.

Step S2 may include plasmarizing the processing gas G. The reaction between the processing gas G and the liquid L may be promoted by the plasmarization of the processing gas G.

Figures 2A, 2B, 2C:
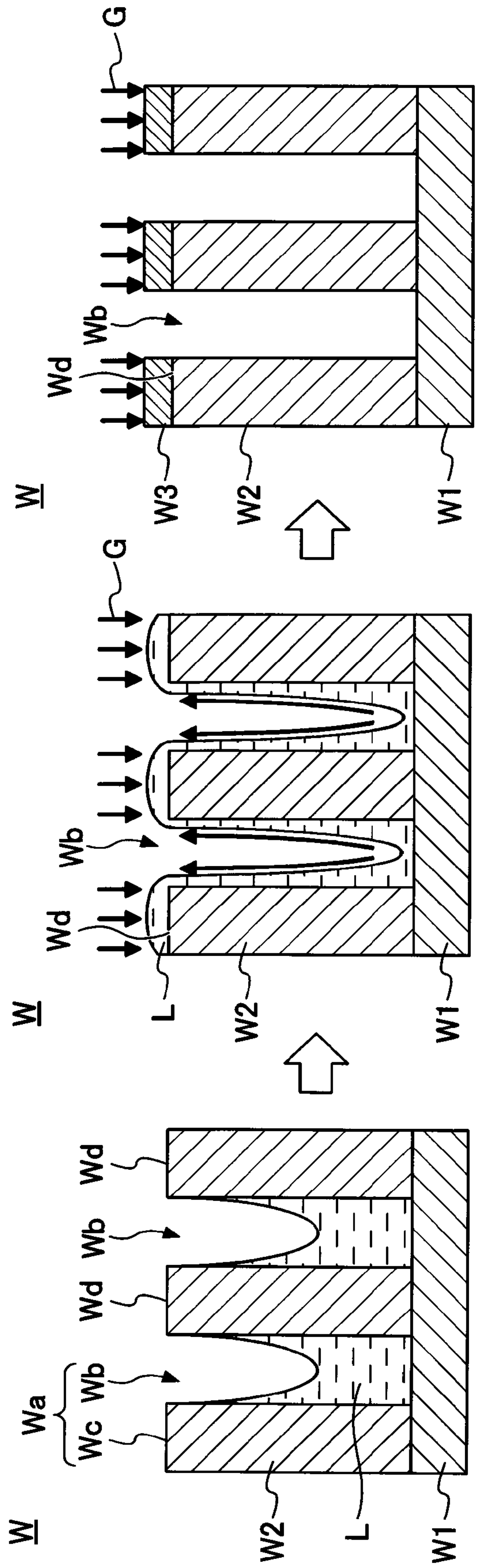
FIGS. 2A to 2C are cross-sectional views showing an example of a substrate, with FIG. 2A being a cross-sectional view after step S1 and before step S2, FIG. 2B being a cross-sectional view during step S2, and FIG. 2C being a cross-sectional view after step S2.

In the substrate processing method, steps S1 and S2 are performed once in FIG. 1, but steps S1 to S2 may be performed repeatedly. The number of times steps S1 to S2 are repeated is also called the number of cycles. The thickness of the film W3 may be controlled by the number of cycles. The number of cycles is preset.

Next, a film forming apparatus 1 will be described with reference to FIG. 3. The film forming apparatus 1 includes a substantially cylindrical airtight processing container 2. An exhaust chamber 21 is provided in a central portion of the bottom wall of the processing container 2. The exhaust chamber 21 has, for example, a substantially cylindrical shape protruding downward. An exhaust pipe 22 is connected to the exhaust chamber 21, for example, on the side surface of the exhaust chamber 21.

An exhaust part 24 is connected to the exhaust pipe 22 via a pressure regulating part 23. The pressure regulating part 23 includes, for example, a pressure regulating valve such as a butterfly valve. The exhaust pipe 22 is configured so as to decompress the interior of the processing container 2 by the exhaust part 24. A transfer port 25 is provided in the side surface of the processing container 2. The transfer port 25 is opened/closed by a gate valve 26. The substrate W is loaded/unloaded between the processing container 2 and a transfer chamber (not shown) through the transfer port 25.

A stage 3 is provided inside the processing container 2. The stage 3 is a holder that horizontally holds the substrate W with the surface Wa of the substrate W facing upward. The stage 3 has a substantially circular shape in a plan view and is supported by a support member 31. The surface of the stage 3 is formed with a substantially circular concave portion 32 for placing a substrate W having a diameter of 300 mm, for example. The concave portion 32 has an inner diameter slightly larger than the diameter of the substrate W. The depth of the concave portion 32 is substantially the same as the thickness of the substrate W, for example. The stage 3 is made of a ceramic material such as aluminum nitride (AlN). The stage 3 may also be made of a metal material such as nickel (Ni). Instead of the concave portion 32, a guide ring for guiding the substrate W may also be provided on the periphery of the surface of the stage 3.

For example, a grounded lower electrode 33 is buried in the stage 3. A heating mechanism 34 is buried under the lower electrode 33. The heating mechanism 34 heats the substrate W placed on the stage 3 to a set temperature by receiving power from a power supply (not shown) based on a control signal from a controller 100. When the stage 3 is entirely made of metal, the entire stage 3 functions as a lower electrode, so that the lower electrode 33 may not be buried in the stage 3. The stage 3 is provided with a plurality of (for example, three) lift pins 41 for holding and lifting the substrate W placed on the stage 3. The material of the lift pins 41 may be, for example, ceramics such as alumina ($Al_2O_3$), quartz, or the like. A lower end of each lift pin 41 is attached to a support plate 42. The support plate 42 is connected to an elevating mechanism 44 provided outside the processing container 2 via an elevating shaft 43.

The elevating mechanism 44 is installed, for example, in the lower portion of the exhaust chamber 21. A bellows 45 is provided between the elevating mechanism 44 and an opening portion 211 for the elevating shaft 43 formed on the lower surface of the exhaust chamber 21. The shape of the support plate 42 may be a shape that allows it to move up and down without interfering with the support member 31 of the stage 3. The lift pins 41 are configured to be vertically movable between above the surface of the stage 3 and below the surface of the stage 3 by means of the elevating mechanism 44.

A gas supplier 5 is provided on a ceiling wall 27 of the processing container 2 via an insulating member 28. The gas supplier 5 forms an upper electrode and faces the lower electrode 33. A radio-frequency power supply 512 is connected to the gas supplier 5 via a matcher 511. By supplying radio-frequency power of 450 kHz to 2.45 GHz, specifically 450 kHz to 100 MHz, from the radio-frequency power supply 512 to the upper electrode (the gas supplier 5), a radio-frequency electric field is generated between the upper electrode (the gas supplier 5) and the lower electrode 33 to generate capacitively-coupled plasma. A plasma generator 51 includes the matcher 511 and the radio-frequency power supply 512. The plasma generator 51 is not limited to the capacitively-coupled plasma, and may generate other plasma such as inductively-coupled plasma.

The gas supplier 5 includes a hollow gas supply chamber 52. A large number of holes 53 for distributing and supplying a processing gas into the processing container 2 are arranged, for example, evenly on the lower surface of the gas supply chamber 52. A heating mechanism 54 is buried above, for example, the gas supply chamber 52 in the gas supplier 5. The heating mechanism 54 is heated to a set temperature by receiving power from a power supply (not shown) based on a control signal from the controller 100.

A gas supply path 6 is provided in the gas supply chamber 52. The gas supply path 6 communicates with the gas supply chamber 52. Gas sources G61, G62, G63, and G64 are connected to the upstream of the gas supply path 6 via gas lines L61, L62, L63, and L64, respectively.

The gas source G61 is a $TiCl_4$ gas source and is connected to the gas supply path 6 via the gas line L61. The gas line L61 is provided with a mass flow controller M61, a storage tank T61, and a valve V61 sequentially from the side of the gas source G61. The mass flow controller M61 controls a flow rate of a $TiCl_4$ gas flowing through the gas line L61. With the valve V61 closed, the storage tank T61 may store the $TiCl_4$ gas supplied from the gas source G61 through the gas line L61 and increase a pressure of the $TiCl_4$ gas in the storage tank T61. The valve V61 performs the supply/cutoff of the $TiCl_4$ gas to/from the gas supply path 6 by the opening/closing operation.

The gas source G62 is an Ar gas source and is connected to the gas supply path 6 via the gas line L62. The gas line L62 is provided with a mass flow controller M62 and a valve V62 sequentially from the side of the gas source G62. The mass flow controller M62 controls a flow rate of an Ar gas flowing through the gas line L62. The valve V62 performs the supply/cutoff of the Ar gas to/from the gas supply path 6 by the opening/closing operation.

The gas source G63 is an $O_2$ gas source and is connected to the gas supply path 6 via the gas line L63. The gas line L63 is provided with a mass flow controller M63 and a valve V63 sequentially from the side of the gas source G63. The mass flow controller M63 controls a flow rate of an $O_2$ gas flowing through the gas line L63. The valve V63 performs the supply/cutoff of the $O_2$ gas to/from the gas supply path 6 by the opening/closing operation.

The gas source G64 is an $H_2$ gas source and is connected to the gas supply path 6 via the gas line L64. The gas line L64 is provided with a mass flow controller M64 and a valve V64 sequentially from the side of the gas source G64. The mass flow controller M64 controls a flow rate of an $H_2$ gas flowing through the gas line L64. The valve V64 performs the supply/cutoff of the $H_2$ gas to/from the gas supply path 6 by the opening/closing operation.

The film forming apparatus 1 includes the controller 100 and a storage part 101. The controller 100 includes a CPU, a RAM, a ROM, and the like (none of which is shown), and comprehensively controls the film forming apparatus 1 by causing the CPU to execute a computer program stored in the ROM or the storage part 101, for example. Specifically, the controller 100 causes the CPU to execute a control program stored in the storage part 101 to control the operation of each component of the film forming apparatus 1, thereby performing a film-forming process and the like on the substrate W.

Next, the operation of the film forming apparatus 1 will be described with reference to FIG. 3 again. First, the controller 100 opens the gate valve 26, transfers the substrate W into the processing container 2 by a transfer mechanism, and places the substrate W on the stage 3. The substrate W is placed horizontally with the surface Wa facing upward. The controller 100 retracts the transfer mechanism from the processing container 2 and then closes the gate valve 26. Subsequently, the controller 100 heats the substrate W to a predetermined temperature by the heating mechanism 34 of the stage 3 and adjusts the interior of the processing container 2 to a predetermined pressure by the pressure regulating part 23.

Subsequently, in step S1 of FIG. 1, the controller 100 opens the valves V61, V62, and V64 to simultaneously supply a $TiCl_4$ gas, an Ar gas, and an $H_2$ gas into the processing container 2. The valve V63 is closed. A liquid L such as $TiH_xCl_y$, which is generated by a reaction between the $TiCl_4$ gas and the $H_2$ gas, is supplied to the concave portion Wb of the substrate W.

Specific processing conditions of step S1 are, for example, as follows.

Flow rate of $TiCl_4$ gas: 1 sccm to 100 sccm

Flow rate of Ar gas: 10 sccm to 100,000 sccm, specifically 100 sccm to 20,000 sccm Flow rate of $H_2$ gas: 1 sccm to 50,000 sccm, specifically 10 sccm to 10,000 sccm Processing time: 1 second to 1,800 seconds Processing temperature: −100 degrees C. to 390 degrees C., specifically 20 degrees C. to 350 degrees C.

Processing pressure: 0.1 Pa to 10,000 Pa, specifically 0.1 Pa to 2,000 Pa

In step S1, the controller 100 may generate plasma by the plasma generator 51 to promote the reaction between the $TiCl_4$ gas and the $H_2$ gas. When the $TiCl_4$ gas and the $H_2$ gas are simultaneously supplied, the controller 100 plasmarizes both the $TiCl_4$ gas and the $H_2$ gas.

Further, in step S1, the controller 100 may alternatively supply the $TiCl_4$ gas and the $H_2$ gas into the processing container 2 instead of supplying them simultaneously. In this case, the controller 100 may plasmarize only the $H_2$ gas out of the $TiCl_4$ gas and the $H_2$ gas.

After step S1, the valves V61 and V64 are closed. At this time, since the valve V62 remains open, Ar is supplied into the processing container 2, a gas remaining in the processing container 2 is discharged to the exhaust pipe 22, and the interior of the processing container 2 is substituted with an Ar atmosphere.

Subsequently, in step S2 of FIG. 1, the controller 100 opens the valve V63 and supplies an $O_2$ gas into the processing container 2 together with an Ar gas. Due to a reaction between the $O_2$ gas and the liquid L, the liquid L moves from the concave portion Wb to the concave-portion top surface Wd, and a film W3 is selectively formed on the concave-portion top surface Wd.

Specific processing conditions of step S2 are, for example, as follows.

Flow rate of 02 gas: 1 sccm to 100,000 sccm, specifically 1 sccm to 10,000 sccm

Flow rate of Ar gas: 10 sccm to 100,000 sccm, specifically 100 sccm to 20,000 sccm Processing time: 1 second to 1,800 seconds Processing temperature: −100 degrees C. to 390 degrees C., specifically 20 degrees C. to 350 degrees C.

Processing pressure: 0.1 Pa to 10,000 Pa, specifically 0.1 Pa to 2,000 Pa

In step S2, the controller 100 may generate plasma by the plasma generator 51 to promote the reaction between the $O_2$ gas and the liquid L.

After step S2, the controller 100 unloads the substrate W from the processing container 2 in the reverse order to the loading of the substrate W into the processing container 2. The controller 100 may repeat steps S1 and S2 a preset number of times.

Figure 4:
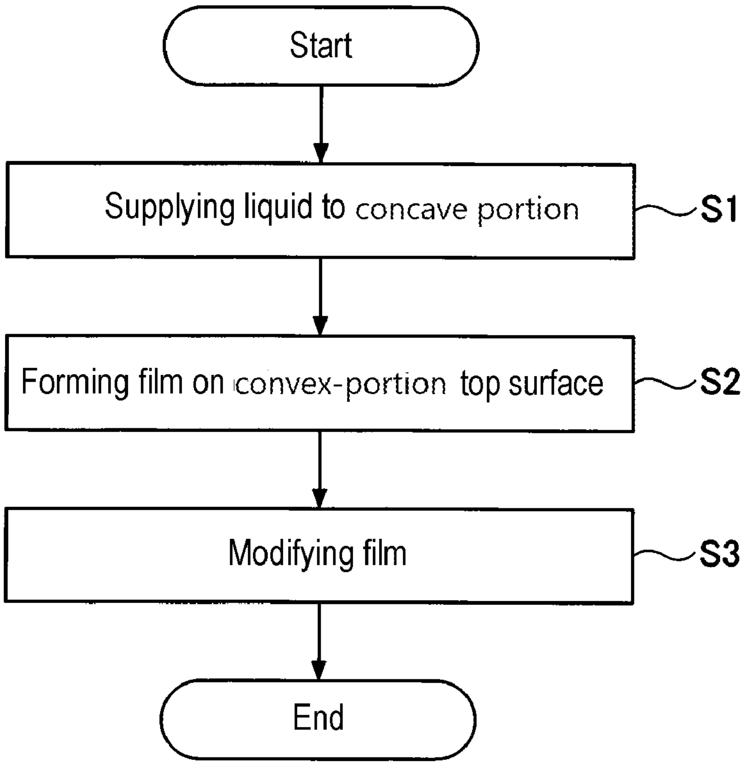
FIG. 4 is a flowchart showing a modification of the film forming method of FIG. 1.

Next, a modification of the film forming method will be described with reference to FIG. 4. The film forming method of this modification includes step S3 in addition to steps S1 and S2 shown in FIG. 1. In step S3, the film W3 formed in step S2 is modified. The film W3 after modification is superior in chemical resistance to the film W3 before modification. For example, the film W3 after modification has a lower etching rate with respect to dilute hydrofluoric acid (DHF) than the film W3 before modification.

The modification of the film W3 includes, for example, at least one of the following operations (A) and (B). In operation (A), a halogen element or a hydrogen element in the film W3 is reduced. In operation (B), the film W3 is densified. The densification of the film W3 may be realized, for example, by terminating dangling bonds of the film W3 with an element contained in a modifying gas or by promoting bonds between existing elements in the film W3.

In step S3, a modifying gas may be supplied to the film W3. When the modifying gas of step S3 and the processing gas G of step S2 are the same gas, they are supplied under different conditions. Specifically, for example, the processing gas G is not plasmarized while the modifying gas is plasmarized. Alternatively, the modifying gas is supplied at a higher temperature or pressure than the processing gas G.

However, the modifying gas in step S3 and the processing gas G in step S2 may be different gases. For example, the processing gas G is a nitrogen gas that is plasmarized, while the modifying gas is an ammonia ($NH_3$) gas that is plasmarized, or a hydrazine ($N_2H_4$) gas. Alternatively, the processing gas G is an oxygen ($O_2$) gas, while the processing gas G is an ozone ($O_3$) gas or water vapor ($H_2O$).

In step S2, the liquid L may be moved to the concave-portion top surface Wd, and in step S3, the film W3 may have desired performance. The controller 100 may repeat steps S1 to S3 a preset number of times.

EXAMPLES

Next, Examples will be described.

Examples 1 and 2

Figure 3:
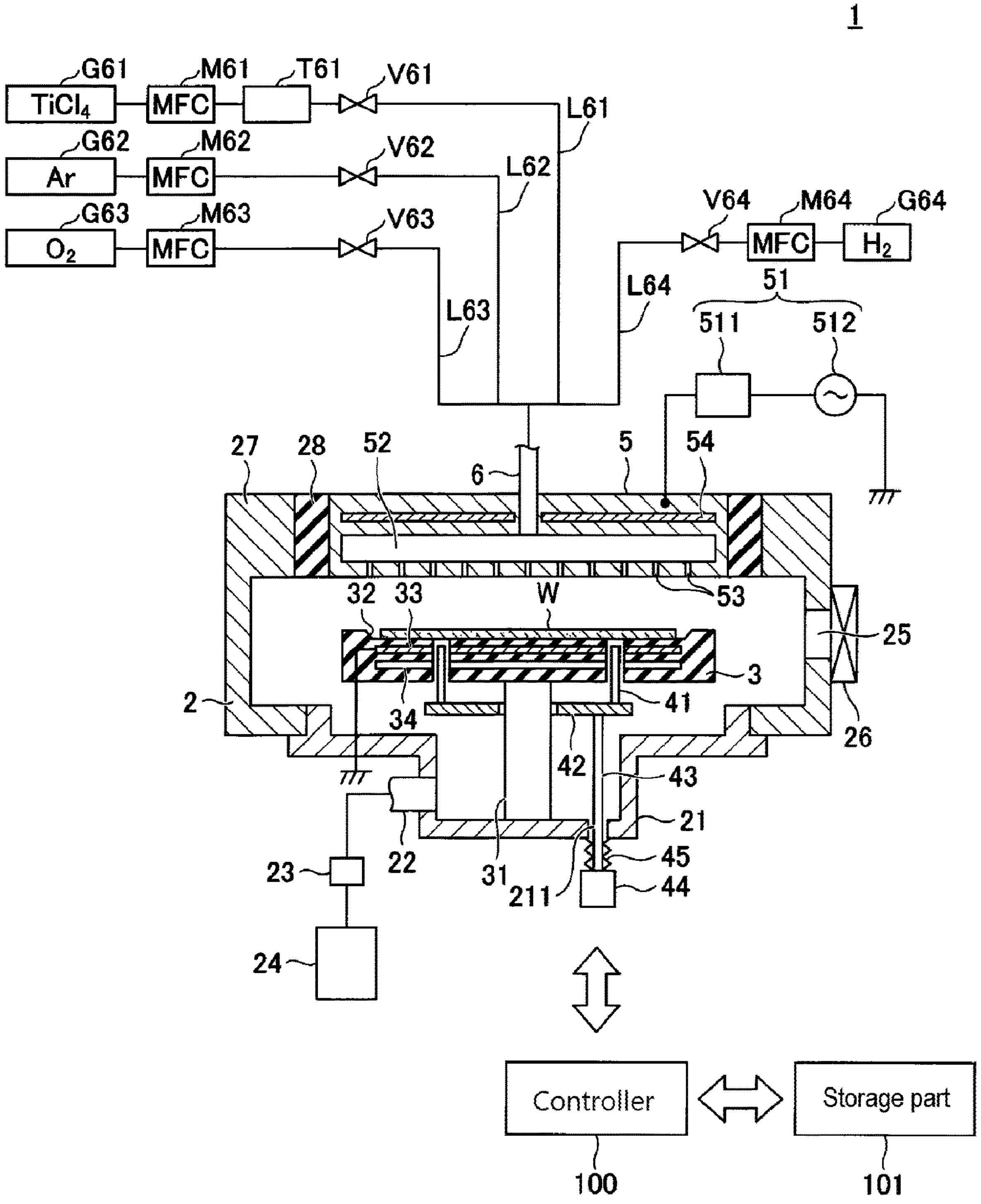
FIG. 3 is a cross-sectional view showing a film forming apparatus according to an embodiment.

In Examples 1 and 2, using the film forming apparatus 1 shown in FIG. 3, steps S1 and S2 were performed under the processing conditions shown in Table 1.

TABLE 1

| | Convex-portion top surface | Concave-portion bottom surface | Step | Temperature [degrees C.] | $TiCl_4$ | $H_2$ | Ar | Other gases supplied | RF | Time [sec] | The number of cycles |
|---|---|---|---|---|---|---|---|---|---|---|---|
| Example 1 | $SiO_2$ | $SiO_2$ | S1 | 130 | ○ | ○ | ○ | — | ON | 60 | 1 |
| | | | S2 | 130 | — | — | ○ | $O_2$ | — | 60 | |
| Example 2 | $SiO_2$ | $SiO_2$ | S1 | 130 | ○ | ○ | ○ | — | ON | 300 | 1 |
| | | | S2 | 130 | — | — | ○ | $O_2$ | — | 60 | |

In Table 1, the "convex-portion top surface" denotes the material of the concave-portion top surface Wd and the material of the uneven film W2. The material of the concave-portion side surface is the same as the material of the concave-portion top surface Wd. The "concave-portion bottom surface" denotes the material of the concave-portion bottom surface and the material of the upper surface of the base substrate W1. Further, "0" of various gases means that various gases are supplied, and "ON" of "RF" means that the gases are plasmarized by radio-frequency power. Furthermore, the "number of cycles" denotes the number of repetitions of steps S1 and S2. The same applies to Tables 2 to 8, which will be described later.

Figure 5A:
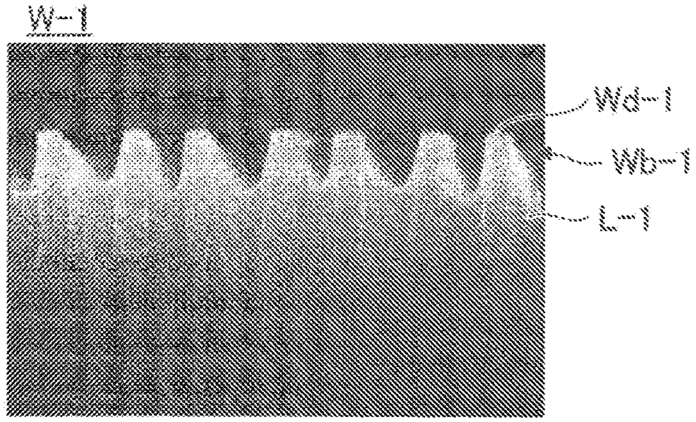
FIGS. 5A to 5C are SEM photographs of a substrate according to Example 1, with FIG. 5A being an SEM photograph after step S1 and before step S2, FIG. 5B being an SEM photograph during step S2, and FIG. 5C being a SEM photograph after step S2.
Figure 5B:
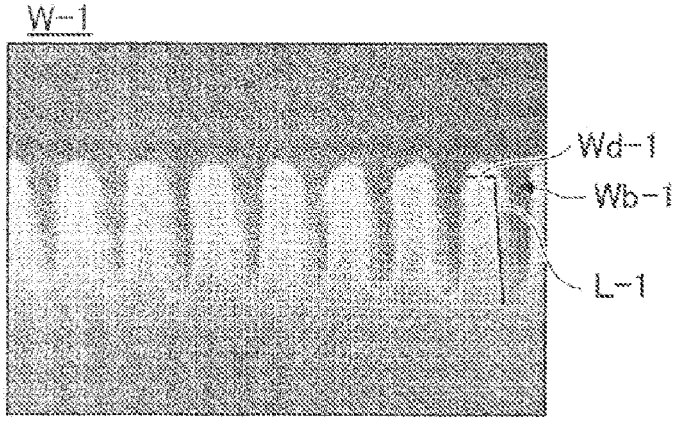
Figure 5C:
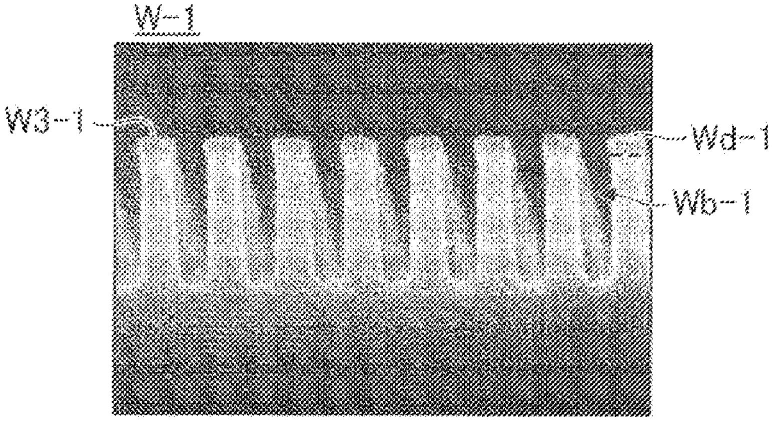

FIGS. 5A to 5C show SEM photographs of a substrate W-1 according to Example 1. As shown in FIG. 5A, a liquid L-1 was supplied to a concave portion Wb-1 by step S1. The amount of liquid L-1 supplied was such that it could fit inside the concave portion Wb-1. Further, as shown in FIG. 5B, when a process was interrupted during step S2, specifically, when the processing time of step S2 was 10 seconds, the state similar to that of FIG. 2B, that is, a state in which the liquid L-1 crawls up from the concave portion Wb-1 toward a concave-portion top surface Wd-1, was confirmed. Further, as shown in FIG. 5C, a film W3-1 was selectively formed on the concave-portion top surface Wd-1 by step S2.

Figure 6A:
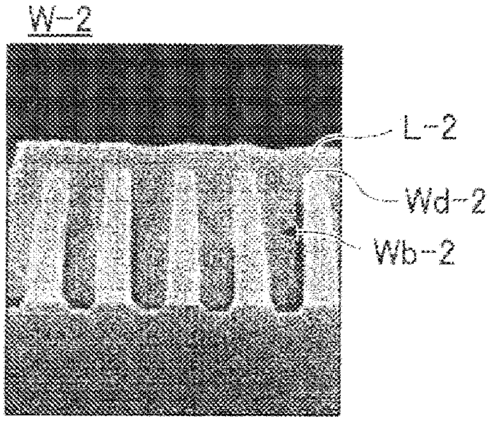
FIGS. 6A and 6B are SEM photographs of a substrate according to Example 2, with FIG. 6A being an SEM photograph after step S1 and before step S2, and FIG. 6B being an SEM photograph after step S2.
Figure 6B:
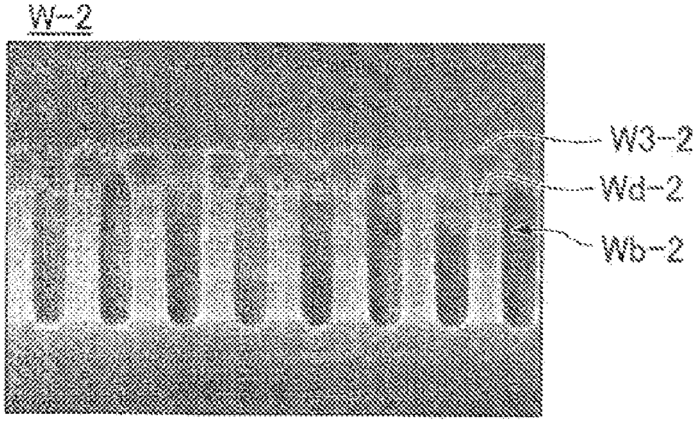

FIGS. 6A and 6B show SEM photographs of a substrate W-2 according to Example 2. As shown in FIG. 6A, a liquid L-2 was supplied to a concave portion Wb-2 by step S1. In Example 2, since the processing time of step S1 was longer and the amount of liquid L-2 supplied was greater than in Example 1, the liquid L-2 was supplied not only to the concave portion Wb-2 but also to a concave-portion top surface Wd-2. Further, as shown in FIG. 6B, a film W3-2 was selectively formed on the concave-portion top surface Wd-2 by step S2.

Example 3

In Example 3, using the film forming apparatus 1 shown in FIG. 3, step S1 was performed under the processing conditions shown in Table 2, and then step S4 was performed under the processing conditions shown in Table 2 without performing step S2. In step S4, an Ar gas alone was supplied into the processing container 2, and a change in the liquid L within the concave portion Wb was observed.

TABLE 2

| | Convex-portion top surface | Concave-portion bottom surface | Step | Temperature [degrees C.] | $TiCl_4$ | $H_2$ | Ar | Other gases supplied | RF | Time [sec] |
|---|---|---|---|---|---|---|---|---|---|---|
| Example 3 | $SiO_2$ | $SiO_2$ | S1 | 130 | ○ | ○ | ○ | — | ON | 120 |
| | | | S4 | 130 | — | — | ○ | — | — | — |

Figure 7:
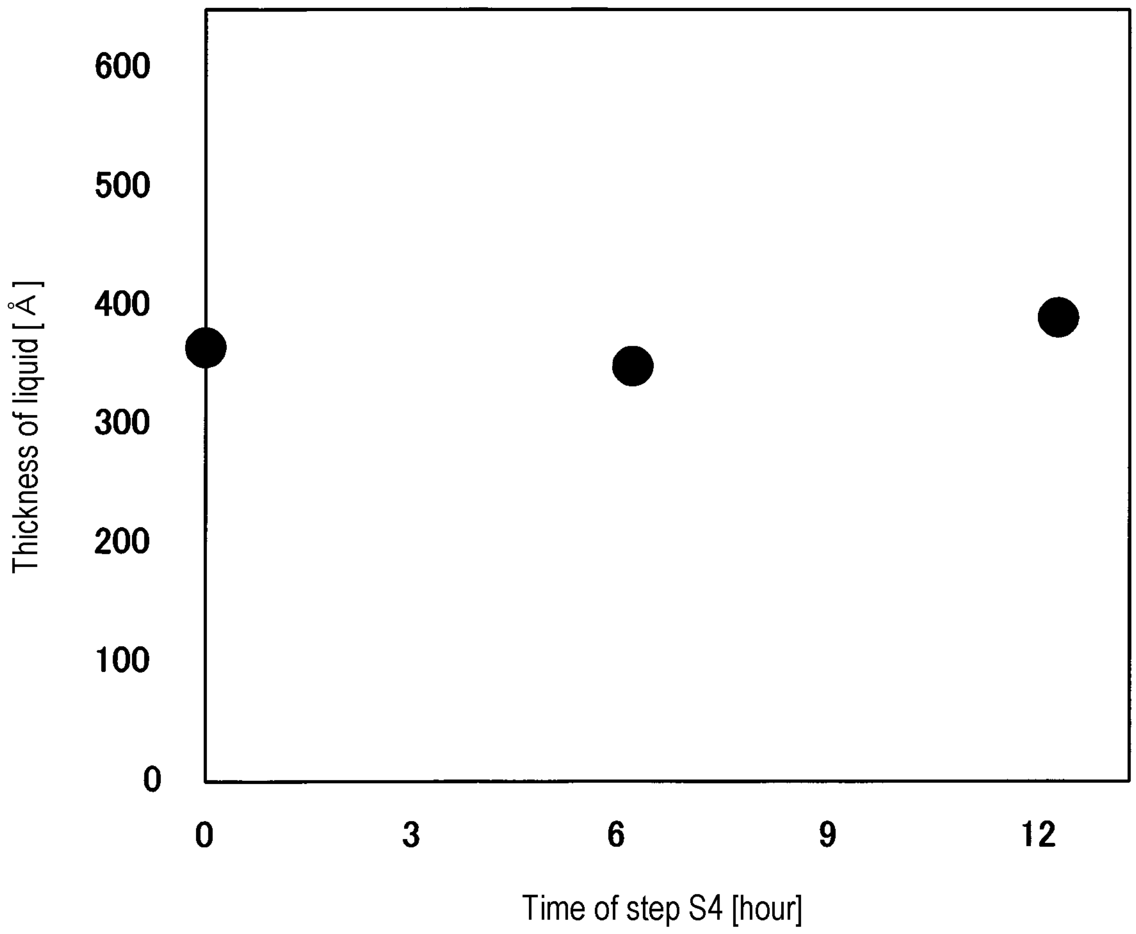
FIG. 7 is a diagram showing a relationship between a processing time of step S4 (Table 2) and a thickness of a liquid in a concave portion according to Example 3.

FIG. 7 shows a relationship between the processing time of step S4 and the thickness of the liquid L in the concave portion Wb according to Example 3. As is clear from FIG. 7, no movement and reduction of the liquid L in the concave portion Wb were observed even after being left in the reduced pressure atmosphere for a long time. This means that the liquid L does not move until the reaction between the liquid L and the processing gas G starts and that the liquid L has a strong intermolecular force and a strong cohesive force, so that it is difficult to evaporate.

Examples 4 to 7

In Examples 4 to 7, using the film forming apparatus 1 shown in FIG. 3, steps S1 and S2 were performed under the processing conditions shown in Table 3.

TABLE 3

| | Convex-portion top surface | Concave-portion bottom surface | Step | Temperature [degrees C.] | $TiCl_4$ | $H_2$ | Ar | Other gases supplied | RF | Time [sec] | The number of cycles |
|---|---|---|---|---|---|---|---|---|---|---|---|
| Example 4 | $SiO_2$ | $SiO_2$ | S1 | 130 | ○ | ○ | ○ | — | ON | 120 | 1 |
| | | | S2 | 130 | — | — | ○ | $O_2$ | — | 120 | |
| Example 5 | $SiO_2$ | $SiO_2$ | S1 | 130 | ○ | ○ | ○ | — | ON | 10 | 10 |
| | | | S2 | 130 | — | — | ○ | $O_2$ | — | 60 | |
| Example 6 | $SiO_2$ | $SiO_2$ | S1 | 130 | ○ | ○ | ○ | — | ON | 10 | 10 |
| | | | S2 | 130 | — | — | ○ | $H_2O$ | — | 60 | |
| Example 7 | $SiO_2$ | $SiO_2$ | S1 | 130 | ○ | ○ | ○ | — | ON | 10 | 10 |
| | | | S2 | 130 | — | — | ○ | $N_2$ | ON | 10 | |

Figure 8A:
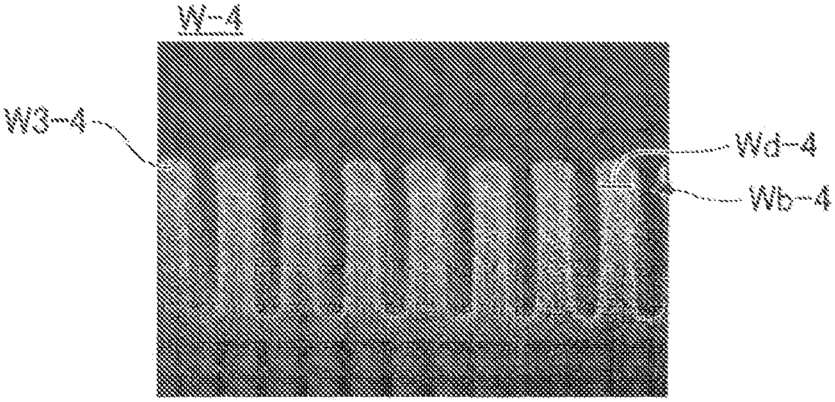
FIG. 8A is an SEM photograph of a substrate after processing according to Example 4.

FIG. 8A shows an SEM photograph of a substrate W-4 after processing according to Example 4. In Example 4, as in Example 1, steps S1 and S2 were performed once each. As a result, a film W3-4 was selectively formed on a concave-portion top surface Wd-4 out of a concave portion Wb-4 and the concave-portion top surface Wd-4.

Figure 8B:
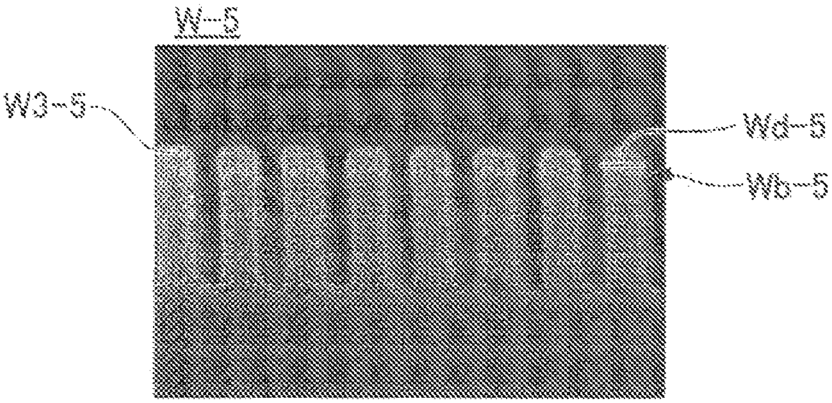
FIG. 8B is an SEM photograph of a substrate after processing according to Example 5.

FIG. 8B shows an SEM photograph of a substrate W-5 after processing according to Example 5. In Example 5, unlike Example 1, steps S1 and S2 were performed ten times each. As a result, a film W3-5 was selectively formed on a concave-portion top surface Wd-5 out of a concave portion Wb-5 and the concave-portion top surface Wd-5.

Figure 8C:
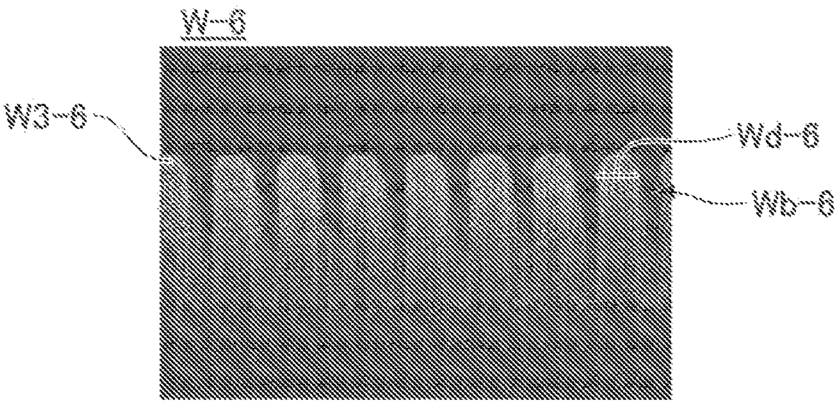
FIG. 8C is an SEM photograph of a substrate after processing according to Example 6.

FIG. 8C shows an SEM photograph of a substrate W-6 after processing according to Example 6. In Example 6, unlike Example 1, instead of the $O_2$ gas in step S2, an $H_2O$ gas was supplied into the processing container 2. As a result, a film W3-6 was selectively formed on a concave-portion top surface Wd-6 out of a concave portion Wb-6 and the concave-portion top surface Wd-6.

Figure 8D:
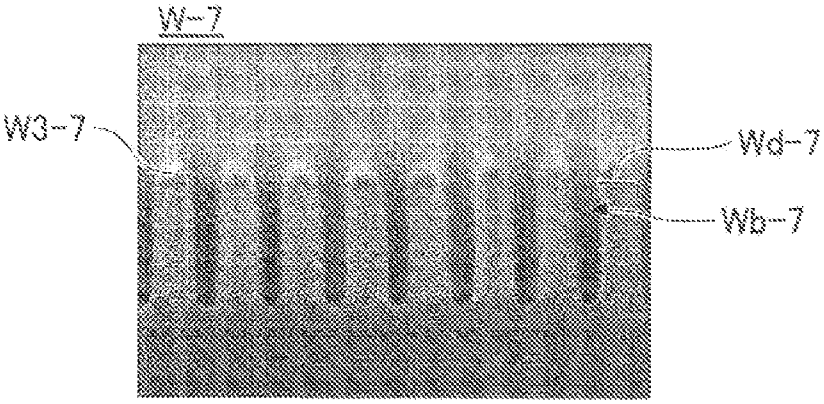
FIG. 8D is an SEM photograph of a substrate after processing according to Example 7.

FIG. 8D shows an SEM photograph of a substrate W-7 after processing according to Example 7. In Example 7, unlike Example 1, instead of the $O_2$ gas in step S2, an $N_2$ gas was supplied into the processing container 2. Further, the $N_2$ gas was plasmarized. As a result, a film W3-7 was selectively fox-ed on a concave-portion top surface Wd-7 out of a concave portion Wb-7 and the concave-portion top surface Wd-7.

As is clear from Examples 4 to 7, various types of processing gases G could be used to selectively form the film W3 on the concave-portion top surface Wd.

Examples 8 to 12

In Examples 8 to 12, using the film forming apparatus 1 shown in FIG. 3, steps S1 and S2 were performed under the processing conditions shown in Table 4.

TABLE 4

| | Convex-portion top surface | Concave-portion bottom surface | Step | Temperature [degrees C.] | $TiCl_4$ | $H_2$ | Ar | Other gases supplied | RF | Time [sec] | The number of cycles |
|---|---|---|---|---|---|---|---|---|---|---|---|
| Example 8 | $TiO_2$ | $TiO_2$ | S1 | 130 | ○ | ○ | ○ | — | ON | 120 | 1 |
| | | | S2 | 130 | — | — | ○ | $O_2$ | — | 120 | |
| Example 9 | SiN | SiN | S1 | 130 | ○ | ○ | ○ | — | ON | 120 | 1 |
| | | | S2 | 130 | — | — | ○ | $O_2$ | — | 120 | |
| Example 10 | Si | Si | S1 | 130 | ○ | ○ | ○ | — | ON | 120 | 1 |
| | | | S2 | 130 | — | — | ○ | $O_2$ | — | 120 | |
| Example 11 | C | C | S1 | 130 | ○ | ○ | ○ | — | ON | 120 | 1 |
| | | | S2 | 130 | — | — | ○ | $O_2$ | — | 120 | |
| Example 12 | Ru | $SiO_2$ | S1 | 130 | ○ | ○ | ○ | — | ON | 120 | 1 |
| | | | S2 | 130 | — | — | ○ | $O_2$ | — | 120 | |

Figure 9A:
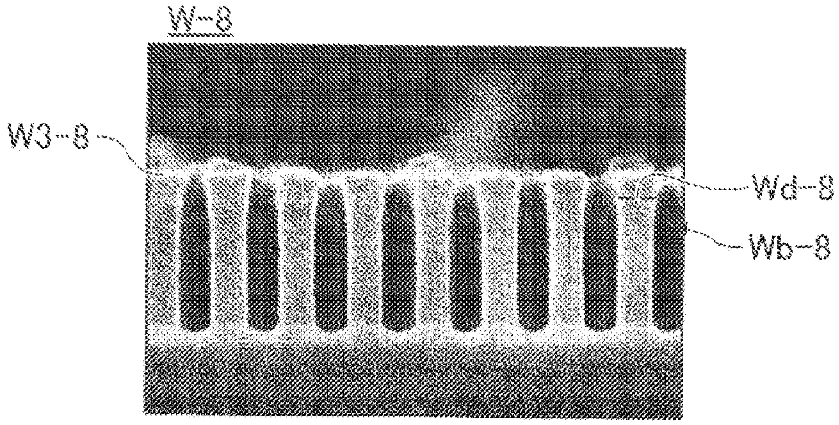
FIG. 9A is an SEM photograph of a substrate after processing according to Example 8.

FIG. 9A shows an SEM photograph of a substrate W-8 after processing according to Example 8. In Example 8, steps S1 and S2 were performed once each under the same conditions as in Example 4, except that the material of the convex-portion top surface and the material of the concave-portion bottom surface were changed to titanium oxide ($TiO_2$). As a result, a film W3-8 was selectively formed on a concave-portion top surface Wd-8 out of a concave portion Wb-8 and the concave-portion top surface Wd-8.

Figure 9B:
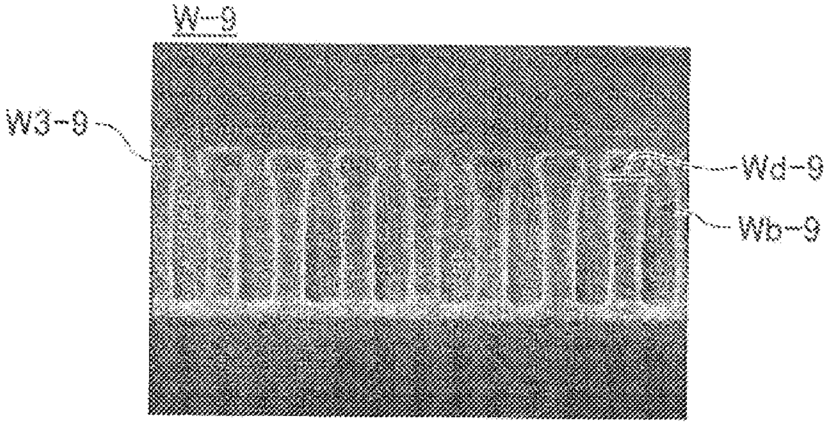
FIG. 9B is an SEM photograph of a substrate after processing according to Example 9.

FIG. 9B shows an SEM photograph of a substrate W-9 after processing according to Example 9. In Example 9, steps S1 and S2 were performed once each under the same conditions as in Example 4, except that the material of the convex-portion top surface and the material of the concave-portion bottom surface were changed to silicon nitride (SiN). As a result, a film W3-9 was selectively formed on a concave-portion top surface Wd-9 out of a concave portion Wb-9 and the concave-portion top surface Wd-9.

Figure 9C:
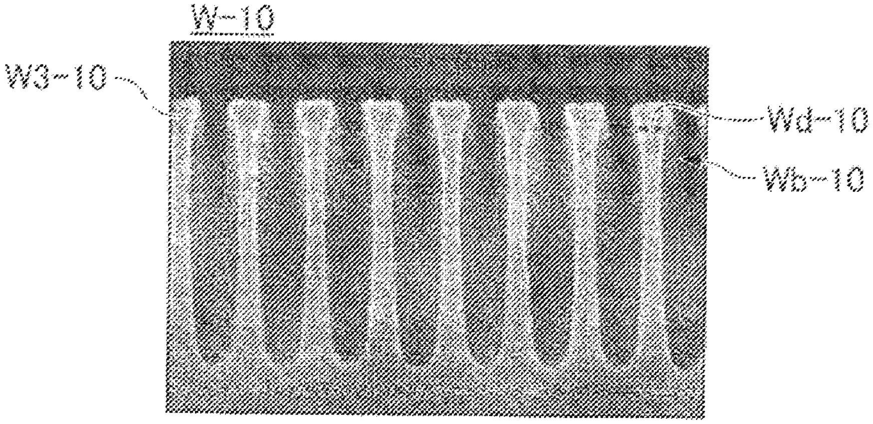
FIG. 9C is an SEM photograph of a substrate after processing according to Example 10.

FIG. 9C shows an SEM photograph of a substrate W-10 after processing according to Example 10. In Example 10, steps S1 and S2 were performed once each under the same conditions as in Example 4, except that the material of the convex-portion top surface and the material of the concave-portion bottom surface were changed to silicon (Si). As a result, a film W3-10 was selectively formed on a concave-portion top surface Wd-10 out of a concave portion Wb-10 and the concave-portion top surface Wd-10.

Figure 10A:
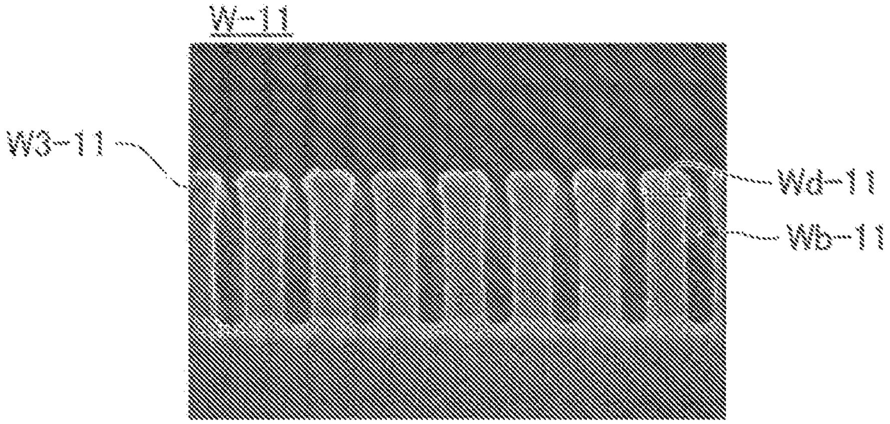
FIG. 10A is an SEM photograph of a substrate after processing according to Example 11.

FIG. 10A shows an SEM photograph of a substrate W-11 after processing according to Example 11. In Example 11, steps S1 and S2 were performed once each under the same conditions as in Example 4, except that the material of the convex-portion top surface and the material of the concave-portion bottom surface were changed to carbon (C). As a result, a film W3-11 was selectively formed on a concave-portion top surface Wd-11 out of a concave portion Wb-11 and the concave-portion top surface Wd-11.

Figure 10B:
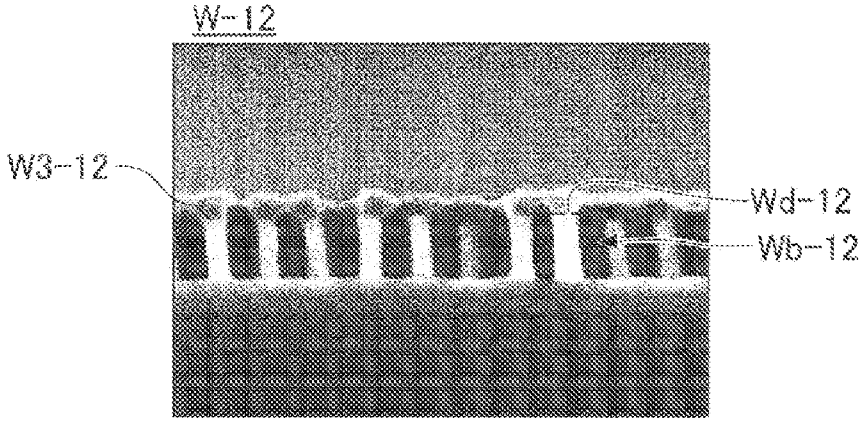
FIG. 10B is an SEM photograph of a substrate after processing according to Example 12.

FIG. 10B shows an SEM photograph of a substrate W-12 after processing according to Example 12. In Example 12, steps S1 and S2 were performed once each under the same conditions as in Example 4, except that the material of the convex-portion top surface was changed to ruthenium (Ru). As a result, a film W3-12 was selectively formed on a concave-portion top surface Wd-12 out of a concave portion Wb-12 and the concave-portion top surface Wd-12.

As is clear from Examples 8 to 12, the substrates W made of various materials could be used to selectively form the film W3 on the concave-portion top surface Wd.

Examples 13 and 14

In Examples 13 and 14, using the film forming apparatus 1 shown in FIG. 3, steps S1 and S2 were performed under the processing conditions shown in Table 5.

TABLE 5

| | Convex-portion top surface | Concave-portion bottom surface | Step | Temperature [degrees C.] | $TiCl_4$ | $H_2$ | Ar | Other gases supplied | RF | Time [sec] | The number of cycles |
|---|---|---|---|---|---|---|---|---|---|---|---|
| Example 13 | $SiO_2$ | $SiO_2$ | S1 | 80 | ○ | ○ | ○ | — | ON | 120 | 1 |
| | | | S2 | 80 | — | — | ○ | $O_2$ | — | 120 | |
| Example 14 | $SiO_2$ | $SiO_2$ | S1 | 200 | ○ | ○ | ○ | — | ON | 120 | 1 |
| | | | S2 | 200 | — | — | ○ | $O_2$ | — | 120 | |

Figure 11A:
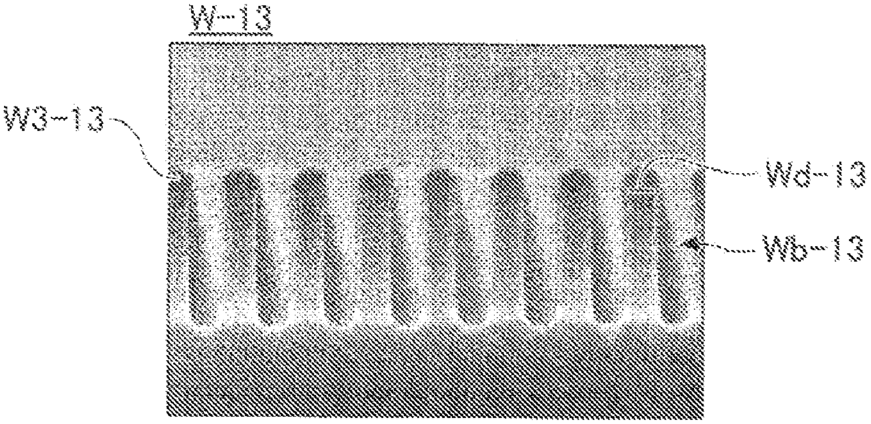
FIG. 11A is an SEM photograph of a substrate after processing according to Example 13.

FIG. 11A shows an SEM photograph of a substrate W-13 after processing according to Example 13. In Example 13, steps S1 and S2 were performed once each under the same conditions as in Example 4, except that the substrate temperature was changed to 80 degrees C. As a result, a film W3-13 was selectively formed on a concave-portion top surface Wd-13 out of a concave portion Wb-13 and the concave-portion top surface Wd-13.

Figure 11B:
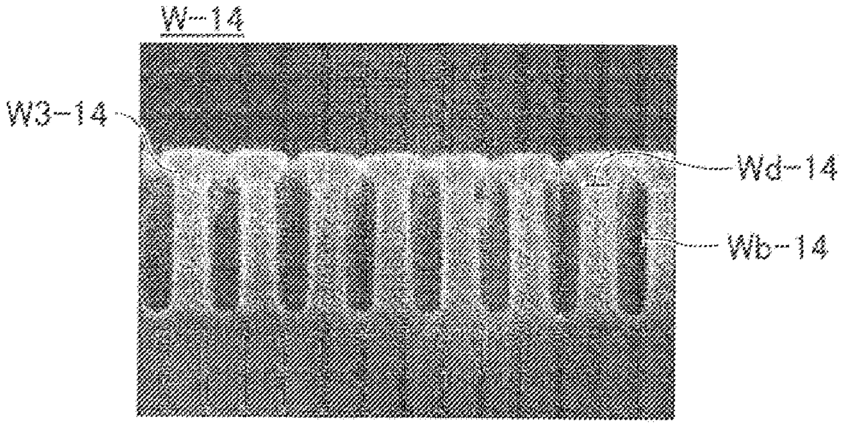
FIG. 11B is an SEM photograph of a substrate after processing according to Example 14.

FIG. 11B shows an SEM photograph of a substrate W-14 after processing according to Example 14. In Example 14, steps S1 and S2 were performed once each under the same conditions as in Example 4, except that the substrate temperature was changed to 200 degrees C. As a result, a film W3-14 was selectively formed on a concave-portion top surface Wd-14 out of a concave portion Wb-14 and the concave-portion top surface Wd-14.

As is clear from Examples 13 and 14, the film W3 could be selectively formed on the concave-portion top surface Wd at various substrate temperatures.

Examples 15 and 16

In Example 15, using the film forming apparatus 1 shown in FIG. 3, steps S1 and S2 were performed under the processing conditions shown in Table 6. On the other hand, in Example 16, using the film forming apparatus 1 shown in FIG. 3, steps S1 to S3 were performed under the processing conditions shown in Table 6.

TABLE 6

| | Convex-portion top surface | Concave-portion bottom surface | Step | Temperature [degrees C.] | $TiCl_4$ | $H_2$ | Ar | Other gases supplied | RF | Time [sec] | The number of cycles |
|---|---|---|---|---|---|---|---|---|---|---|---|
| Example 15 | $SiO_2$ | $SiO_2$ | S1 | 130 | ○ | ○ | ○ | — | ON | 30 | 12 |
| | | | S2 | 130 | — | — | ○ | $O_2$ | — | 60 | |
| Example 16 | $SiO_2$ | $SiO_2$ | S1 | 130 | ○ | ○ | ○ | — | ON | 30 | 12 |
| | | | S2 | 130 | — | — | ○ | $O_2$ | — | 60 | |
| | | | S3 | 130 | — | — | ○ | $O_2$ | ON | 60 | |

In Example 15, when the film W3 formed on the concave-portion top surface Wd was etched with an aqueous solution having an HF concentration of 0.5 mass %, the etching rate thereof was 762.8 Å/min. On the other hand, in Example 16, when the film W3 formed on the concave-portion top surface Wd was etched with an aqueous solution having an HF concentration of 0.5 mass %, the etching rate thereof was 81.3 Å/min. Therefore, the film W3 could be modified by step S3.

Example 17

In Example 17, using the film forming apparatus 1 shown in FIG. 3, steps S1 and S2 were performed under the processing conditions shown in Table 7.

TABLE 7

| | Convex-portion top surface | Concave-portion bottom surface | Step | Temperature [degrees C.] | $Si_2Cl_6$ | $H_2$ | Ar | Other gases supplied | RF | Time [sec] | The number of cycles |
|---|---|---|---|---|---|---|---|---|---|---|---|
| Example 17 | $TiO_2$ | $TiO_2$ | S1 | 130 | ○ | ○ | ○ | — | ON | 60 | 2 |
| | | | S2 | 130 | — | — | ○ | $O_2$ | ON | 60 | |

Figure 12:
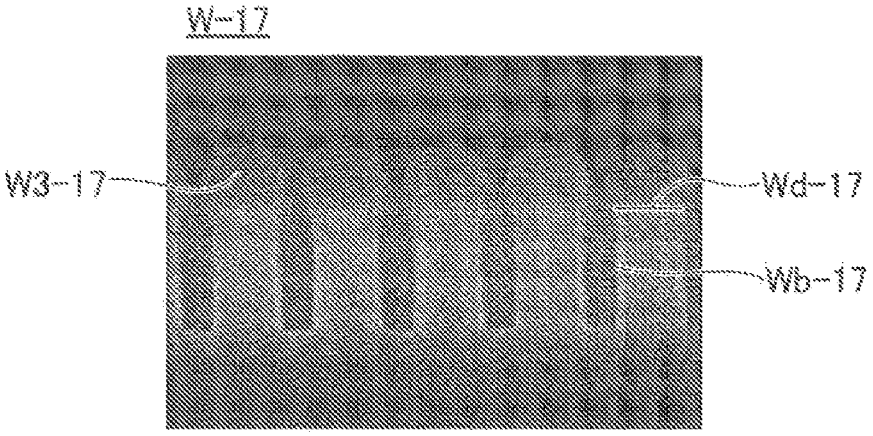
FIG. 12 is an SEM photograph of a substrate after processing according to Example 17.

FIG. 12 shows an SEM photograph of a substrate W-17 after processing according to Example 17. In Example 17, unlike Example 1, in step S1, instead of $TiCl_4$, $Si_2Cl_6$ (HCD) was supplied, as a raw material gas, into the processing container 2. Further, in step S2, an Ar gas and an $O_2$ gas were plasmarized. Further, steps S1 and S2 were performed twice each. Furthermore, the material of the convex-portion top surface and the material of the concave-portion bottom surface were changed to $TiO_2$. As a result, a film W3-17 was selectively formed on a concave-portion top surface Wd-17 out of a concave portion Wb-17 and the concave-portion top surface Wd-17. The same result was obtained even when the material of the convex-portion top surface and the material of the concave-portion bottom surface were changed to $SiO_2$.

Example 18

In Example 18, using the film forming apparatus 1 shown in FIG. 3, steps S1 and S2 were performed under the processing conditions shown in Table 8.

TABLE 8

| | Convex-portion top surface | Concave-portion bottom surface | Step | Temperature [degrees C.] | $SnCl_4$ | $H_2$ | Ar | Other gases supplied | RF | Time [sec] | The number of cycles |
|---|---|---|---|---|---|---|---|---|---|---|---|
| Example 18 | $SiO_2$ | $SiO_2$ | S1 | 90 | ○ | ○ | ○ | — | ON | 60 | 1 |
| | | | S2 | 90 | — | — | ○ | $O_2$ | — | 120 | |

Figure 13:
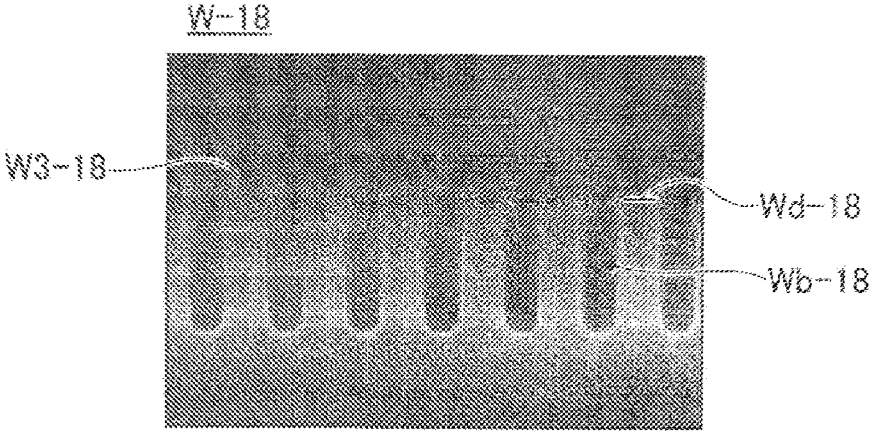
FIG. 13 is an SEM photograph of a substrate after processing according to Example 18.

FIG. 13 shows an SEM photograph of a substrate W-18 after processing according to Example 18. In Example 18, unlike Example 1, in step S1, instead of $TiCl_4$, $SnCl_4$ was supplied as a raw material gas into the processing container 2. As a result, a film W3-18 was selectively formed on a concave-portion top surface Wd-18 out of a concave portion Wb-18 and the concave-portion top surface Wd-18.

As is clear from Examples 17 and 18, various raw material gases could be used to selectively form the film W3 on the concave-portion top surface Wd.

Although the embodiments of the film forming method and the film forming apparatus according to the present disclosure have been described above, the present disclosure is not limited to the above embodiments and the like. Various changes, modifications, substitutions, additions, deletions, and combinations are possible within the scope of the claims. These also naturally belong to the technical scope of the present disclosure.

This application claims priority based on Japanese Patent Application No. 2020-082840 filed with the Japan Patent Office on May 8, 2020 and Japanese Patent Application No. 2021-064172 filed with the Japan Patent Office on Apr. 5, 2021, and the entire disclosures of Japanese Patent Application Nos. 2020-082840 and 2021-064172 are incorporated herein in their entirety by reference.

EXPLANATION OF REFERENCE NUMERALS

W: Substrate
Wa: Surface
Wb: Concave portion
Wc: Convex portion
Wd: Convex-portion top surface
W3: Film
L: Liquid

What is claimed is:

1. A film forming method comprising:
supplying a liquid to a concave portion of a substrate whose surface includes the concave portion and a convex portion which are adjacent to each other; and
selectively forming a film on a top surface of the convex portion of the surface of the substrate by supplying a processing gas, which chemically changes the liquid, to the surface of the substrate, and moving the liquid, which is in a liquid state, from the concave portion to the top surface of the convex portion by a reaction between the processing gas and the liquid.

2. The film forming method of claim 1, wherein the liquid is a halide.

3. The film forming method of claim 2, wherein the supplying the liquid to the concave portion includes forming the liquid by a reaction between a raw material gas of the halide and a reaction gas that reacts with the raw material gas.

4. The film forming method of claim 3, wherein the supplying the liquid to the concave portion includes:
plasmarizing both the raw material gas and the reaction gas when simultaneously supplying the raw material gas and the reaction gas; and
plasmarizing the reaction gas when alternately supplying the raw material gas and the reaction gas.

5. The film forming method of claim 1, wherein the liquid is an ionic liquid.

6. The film forming method of claim 1, wherein the liquid is liquid metal.

7. The film forming method of claim 1, wherein the liquid is a liquid polymer.

8. The film forming method of claim 1, wherein the liquid is supplied to the concave portion of the substrate by a spin coating method.

9. The film forming method of claim 7, wherein the liquid is synthesized inside a processing container that accommodates the substrate, and is supplied to the concave portion of the substrate.

10. The film forming method of claim 1, wherein the processing gas that chemically changes the liquid contains an element to be introduced into the liquid.

11. The film forming method of claim 10, wherein the processing gas that chemically changes the liquid includes an oxygen-containing gas.

12. The film forming method of claim 10, wherein the processing gas that chemically changes the liquid includes a nitrogen-containing gas.

13. The film forming method of claim 10, wherein the processing gas that chemically changes the liquid includes a gas of hydride.

14. The film forming method of claim 13, wherein the hydride contains Si, Ge, B, C, or P.

15. The film forming method of claim 1, wherein the processing gas that chemically changes the liquid degases an element that constitutes the liquid.

16. The film forming method of claim 15, wherein the processing gas that chemically changes the liquid includes a reducing gas.

17. The film forming method of claim 16, wherein the reducing gas is a hydrogen gas or a deuterium gas.

18. The film forming method of claim 1, wherein the selectively forming the film on the top surface of the convex portion includes plasmarizing the processing gas that chemically changes the liquid.

19. The film forming method of claim 1, comprising:
repeating the supplying the liquid to the concave portion and the selectively forming the film on the top surface of the convex portion.

20. The film forming method of claim 1, further comprising:
modifying the film formed on the top surface of the convex portion.

21. The film forming method of claim 1, wherein a temperature of the substrate is lower than a decomposition point of the liquid when the liquid is supplied to the concave portion.

* * * * *